US009012336B2

(12) United States Patent
Pan et al.

(10) Patent No.: US 9,012,336 B2
(45) Date of Patent: Apr. 21, 2015

(54) METHOD FOR CONFORMAL TREATMENT OF DIELECTRIC FILMS USING INDUCTIVELY COUPLED PLASMA

(71) Applicant: Applied Materials, Inc., Santa Clara, CA (US)

(72) Inventors: Heng Pan, Santa Clara, CA (US); Matthew Scott Rogers, Mountain View, CA (US); Johanes F. Swenberg, Los Gatos, CA (US); Christopher S. Olsen, Fremont, CA (US); Wei Liu, San Jose, CA (US); David Chu, Campbell, CA (US); Malcom J. Bevan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/858,922

(22) Filed: Apr. 8, 2013

(65) Prior Publication Data

US 2014/0302686 A1  Oct. 9, 2014

(51) Int. Cl.
*H01L 21/469* (2006.01)
*H01L 21/31* (2006.01)
*H01L 21/02* (2006.01)

(52) U.S. Cl.
CPC .... *H01L 21/02252* (2013.01); *H01L 21/02112* (2013.01)

(58) Field of Classification Search
None
See application file for complete search history.

(56) References Cited

U.S. PATENT DOCUMENTS

| 5,186,718 | A | 2/1993 | Tepman et al. |
| 6,077,737 | A * | 6/2000 | Yang et al. ................. 438/240 |
| 6,114,259 | A * | 9/2000 | Sukharev et al. ............ 438/789 |
| 6,260,266 | B1 * | 7/2001 | Tamaki ........................ 29/852 |
| 6,451,179 | B1 * | 9/2002 | Xu et al. .................. 204/192.15 |
| 6,960,781 | B2 * | 11/2005 | Currie et al. ................... 257/19 |
| 7,033,937 | B2 * | 4/2006 | Toyoda et al. ................ 438/680 |
| 7,700,474 | B2 * | 4/2010 | Cerio, Jr. ..................... 438/597 |
| 7,709,345 | B2 * | 5/2010 | Sandhu et al. ............... 438/424 |
| 7,732,342 | B2 | 6/2010 | Balseanu et al. |
| 7,943,531 | B2 * | 5/2011 | Nemani et al. ............... 438/787 |
| 8,129,290 | B2 | 3/2012 | Balseanu et al. |
| 8,138,104 | B2 | 3/2012 | Balseanu et al. |
| 8,173,554 | B2 | 5/2012 | Lee et al. |
| 8,441,105 | B2 * | 5/2013 | Sato et al. .................... 257/620 |
| 8,524,589 | B2 * | 9/2013 | Rogers ........................ 438/593 |
| 8,617,348 | B1 * | 12/2013 | Liu et al. ................. 156/345.31 |
| 2006/0269693 | A1 | 11/2006 | Balseanu et al. |
| 2007/0249160 | A1 * | 10/2007 | Turner et al. ................. 438/637 |
| 2009/0137132 | A1 | 5/2009 | Bhatia et al. |
| 2009/0233438 | A1 * | 9/2009 | Ding et al. ................... 438/627 |
| 2010/0248497 | A1 | 9/2010 | Bevan et al. |

FOREIGN PATENT DOCUMENTS

WO  WO-2009/149167  12/2009

* cited by examiner

*Primary Examiner* — Brett Feeney
*Assistant Examiner* — Khanh Duong
(74) *Attorney, Agent, or Firm* — Servilla Whitney LLC

(57) ABSTRACT

Disclosed are apparatus and methods for processing a substrate. The substrate having a feature with a layer thereon is exposed to an inductively coupled plasma which forms a substantially conformal layer.

18 Claims, 3 Drawing Sheets

METHOD FOR CONFORMAL TREATMENT OF DIELECTRIC FILMS USING INDUCTIVELY COUPLED PLASMA

BACKGROUND

Embodiments of the invention are directed to apparatus and methods for preparing dielectric films. More specifically, embodiments of the invention are directed to apparatus and methods for the treatment of deposited dielectric films with 3D conformality and good electrical and physical properties.

The scaling of semiconductor devices, such as dynamic random access memory (DRAM), logic devices, and the like, may be limited by gate leakage ($J_g$). For example, as thickness of a gate dielectric layer is scaled, current may leak between the channel and the gate of a transistor device causing device failure. The gate leakage may be reduced by incorporating nitrogen into the gate dielectric layer. For example, a gate dielectric layer at the 32 nm node may comprise silicon oxynitride (SiON), where the presence of nitrogen reduces gate leakage in the device.

Typically, nitrogen is incorporated into the gate dielectric layer by a plasma nitridation process that provides for gate leakage reduction at the expense of other desired properties, for example, flat band voltage ($V_{fb}$), threshold voltage ($V_t$), and mobility. For example, increased nitrogen content in the gate dielectric layer may undesirably increase $V_t$ and excessively decrease mobility. Further, oxygen may diffuse from the gate dielectric layer under typical processing conditions, thus further reducing device performance, for example by degrading the dielectric properties of the gate dielectric layer.

Besides nitridation of dielectric films, there are other post-treatment processes, for example, densification of deposited films. As the thermal budget imposes more restriction on processing temperature, dielectric deposition is moving towards low temperature processes. However, low temperature processes suffer from poor electrical and physical properties. Dielectric films with 3D conformality and good electrical and physical properties are extremely important for next generation of devices. To realize conformal film (good step coverage) at low temperature, CVD or ALD deposition processes are commonly used. These films generally require plasma treatment or other treatments to improve the film quality. Currently, plasma treatment of semiconductor features suffers from non-conformality. This means that, for example, the side wall(s) of the features (e.g., trenches), are treated to a different extend compared to the top and bottom of the feature.

Accordingly, there is an ongoing need in the art for methods and apparatus to achieve more conformal treatment of deposited or formed films.

SUMMARY

One or more embodiments of the invention are directed to methods of forming a film. A substrate having a first layer thereon is placed on a substrate support of a processing chamber. The first layer comprises a structure including at least one sidewall. The substrate has a film deposited on the at least one sidewall of the structure. The film is exposed to an inductively coupled plasma formed from a process gas to form a substantially conformal film.

In some embodiments, the film comprises a nitride film. In one or more embodiments, the process gas comprises one or more of nitrogen and a nitrogen-containing compound and nitrogen-inert gas mixture.

In some embodiments, the film comprises an oxide film. In one or more embodiments, the process gas comprises one or more of oxygen and an oxygen-containing gas and oxygen-inert gas mixture In some embodiments, the film has a thickness less than about 300 Å.

One or more embodiments further comprise depositing the film on the substrate. In some embodiments, the film is deposited by one or more of an atomic layer deposition process and a chemical vapor deposition process. In one or more embodiments, the film has a thickness less than about 300 Å.

Some embodiments further comprise heating the substrate to a temperature less than about 600° C.

In some embodiments, depositing the film on the substrate and exposing the substrate to the inductively coupled plasma occurs in a single processing chamber.

In one or more embodiments, the film is deposited in a first chamber and the method further comprises moving the substrate from the first chamber to a second chamber before exposing the film to the inductively coupled plasma. In some embodiments, the substrate is not exposed to ambient conditions during movement from the first chamber to the second chamber.

Additional embodiments of the invention are directed to methods of forming a film. A substrate having a first layer thereon is placed on a substrate support of a first processing chamber. The first layer includes a structure with at least one sidewall. A film is deposited on the substrate in the first chamber so that the film covers at least one sidewall of the structure and has a thickness less than about 300 Å. The film is exposed to an inductively coupled plasma formed from a process gas to form a substantially conformal film on the at least one sidewall. Deposition and exposure to plasma are repeated until a film of desired thickness is formed so that the film on the at least one sidewall being substantially conformal.

In some embodiments, depositing the film on the substrate is performed by atomic layer deposition and the film has a thickness of about one monolayer before exposure to the inductively coupled plasma.

One or more embodiments further comprise heating the substrate to temperatures less than about 600° C. during deposition and exposure to the plasma.

In some embodiments, the process gas comprises one or more of nitrogen, oxygen, a nitrogen-containing compound and an oxygen-containing compound.

One or more embodiments further comprise moving the substrate from the first chamber to a second chamber before exposure to the inductively coupled plasma. In some embodiments, the first chamber and the second chamber are part of a cluster tool and are connected to a central transfer station comprising a robot to move the substrate from the first chamber to the second chamber without exposing the substrate to the ambient environment.

Further embodiments of the invention are directed to method of forming a film. The methods comprise sequentially depositing a film on a surface of a substrate and exposing the film to an inductively coupled plasma. The film has a thickness less than about 300 Å and is deposited on at least a sidewall of a structure on the surface of the substrate. The film on the sidewall is exposed to the inductively coupled plasma to form a substantially conformal layer on the sidewall.

Some embodiments further comprise biasing the substrate with DC or AC power.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1A:
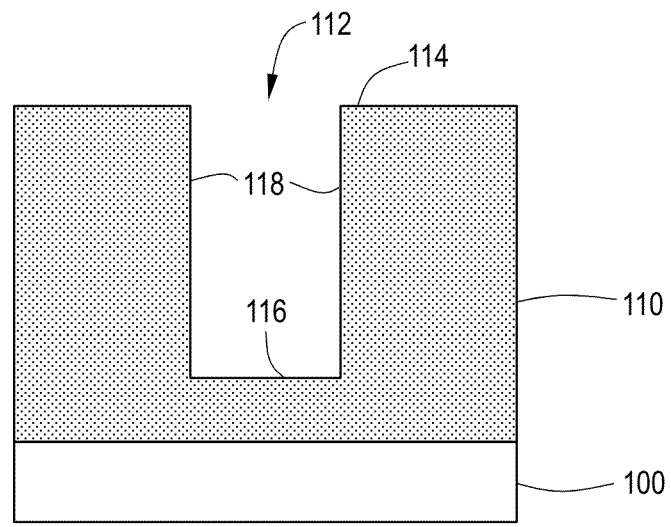
FIGS. 1A through 1C show cross-sectional schematics of a typical deposition process in accordance with one or more embodiments of the invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Some embodiments of the invention are directed to hardware including an inductively coupled plasma (ICP) chamber. This ICP chamber can be clustered with or integrated with a film deposition chamber. For example, an atomic layer deposition (ALD) chamber can be used to form a oxide film. The oxide film can then be treated with an inductively coupled plasma to improve the film quality.

The inventors have found that treating a dielectric film with an inductively coupled plasma is surprisingly superior to treatment with a capacitively coupled plasma. Without being bound by any particular theory of operation, it is believed that an inductively coupled plasma produces species with low ion energy, especially with pulsed configurations, and wider angular distribution. Both the neutral radicals and ions generated by ICP plasma contribute to the side wall treatment. Due to the incident of active species (radicals and ions) on side wall, the conformal treatment can be realized by optimizing ICP plasma conditions. In addition, the treatment is a self-saturation process, by exposing the structure to ICP plasma for sufficient time the treatment difference from top, side and bottom can be minimized. According to some embodiments, more conformal treatment can be realized by performing cyclic treatment and deposition (or formation) with each layer having a thickness less than about 300 Å. In some embodiments, cyclically depositing a film and plasma treating the film allows for the treatment of relatively thick films. The cyclic treatment and deposition can be done within a single chamber or between two separate chambers. In some embodiments, the treatment is performed on a layer having a thickness less than about 200 Å, 100 Å, 50 Å, 40 Å, 30 Å, 20 Å or 10 Å.

Accordingly, one or more embodiments of the invention are directed to methods of forming a film on a substrate. The film can be any suitable film including, but not limited to, nitrides and oxides. For example, the film may be formed as part of an atomic layer deposition (ALD) process in which a oxide or nitride film is formed.

The substrate may have various dimensions, such as 200 or 300 mm diameter wafers, as well as rectangular or square panels. The substrate may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOD, carbon doped silicon oxides, silicon nitride, doped silicon, germanium, gallium arsenide, glass, sapphire, or the like.

The substrate surface can be pretreated or have features formed thereon. As used in this specification and the appended claims, the term "features" is used to describe any three-dimensional structures formed on the substrate. These structures can include, but are not limited to, trenches in which there is a top surface, at least one sidewall and a bottom surface. The feature, or structure, may be a partially fabricated semiconductor device such as Logic, DRAM or Flash memory devices. The substantially conformal layers formed by one or more embodiments of the invention can be one or more of a gate dielectric layer, a tunnel oxide layer, a spacer layer, or any suitable layer of a semiconductor structure. The semiconductor device (when completed) may be, for example, a field effect transistor (FET), dynamic random access memory (DRAM), a flash memory device, a 3D FINFET device, or the like. The first layer 120 may be, for example, utilized as a gate dielectric layer of a transistor device, a tunnel oxide layer in a flash memory device, a spacer layer atop a gate structure, an inter-poly dielectric (IPD) layer of a flash memory device, or the like.

While the treatment processes and embodiments described herein are related to film densification, the mechanism of densification for nitride film is to remove the SiH and NH bonds. The mechanism of densification of oxide film is to reorganize the Si—O bonds. It will be understood that this is merely one possible process and film. The densification process was chosen merely as a vehicle for describing process steps and conditions but should not be taken as limiting the scope of the invention. Other processes, for example, oxidation, nitridation, deposition, implantation and etching can be employed.

The process is described herein with respect to the partially fabricated semiconductor structure depicted in FIG. 1A. This Figure shows a substrate 100 with a first layer 110 on the surface of the substrate 100. The layer 110 includes a trench-type structure 112 having a top 114, bottom 116 and sidewalls 118. Those skilled in the art will understand that when used in this context, the term substrate can also include a portion of a substrate or a film already formed on the surface of a substrate. The structure 112 shown in FIG. 1A includes two sidewalls 118, but it will be understood that other structures 112 could be used having one, two, three, four or more sidewalls, or parts of sidewall. The trench type structure can have up to 30:1 aspect ratio.

The first layer 120 may have a thickness in the range of about 0.3 to about 10 nm. In the ALD example described, the first layer 120 may comprise an oxide layer, such as silicon oxide ($SiO_2$), hafnium oxide ($HfO_2$), hafnium silicate (Hf-$SiO_x$), or any suitable oxide layer used in a semiconductor device. For example, in some embodiments, the oxide layer may be a native oxide layer, or formed by any suitable oxidation process. The first layer 120 need not be limited to an oxide layer, and other suitable layers may benefit from the inventive methods disclosed herein. For example, other suitable embodiments of the first layer 120 may include other silicon-containing layers such as SiN, SiC, or the like. The first layer 120 can also be a stack of layers, such as a first sub-layer of $SiO_2$ and a second sub-layer of $HfO_2$ or a first sub-layer of $SiO_2$ and a second sub-layer of $HfSiO_x$, or the like.

Figure 1B:
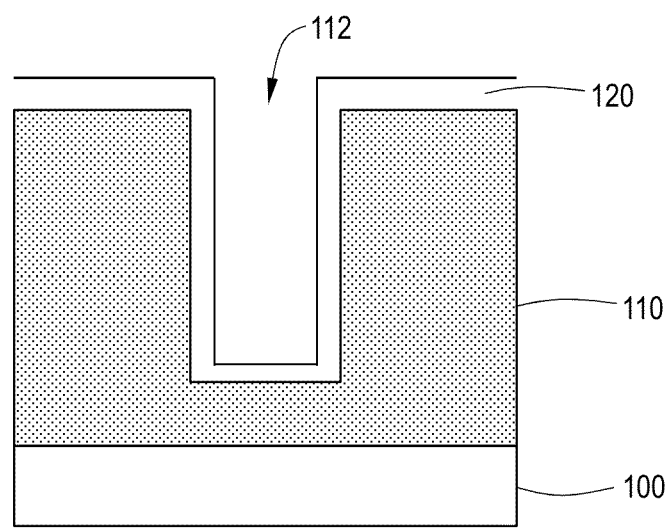

As shown in FIG. 1B, a film 120 can be deposited onto the first layer 110. The film can be any suitable film which may benefit from, for example, densification. In some embodiments, the film comprises an oxide layer, such as silicon oxide ($SiO_2$), hafnium oxide ($HfO_2$), hafnium silicate ($HfSiO_x$), or any suitable oxide layer used in a semiconductor device and requiring densification. For example, in some embodiments, the oxide layer may be a native oxide layer, or formed by any suitable densification process.

In some embodiments, the film 120 deposited or formed on the first layer 110 may be of low quality. As used in this specification and the appended claims, the term "low quality" means that the film is not generally suitable for use without process changes or treatment. A low quality oxide film can have, for example, an interface defect density $(D_{it}) > 10^{12}$ $cm^{-2} eV^{-1}$, and a leakage current $>4 \times 10^{-9}$ $A/cm^2$.

The first layer 110 and/or the film 120 can be, for example, a dielectric material, a nitride film or a film to be densified, an oxidize film or a film to be densified, and mixtures thereof. The substrate may be heated, if desired, prior to formation of the first layer 110 and/or film 120, during formation of the first layer 110 and/or film 120 and/or after formation of the first layer 110 and/or film 120. In some embodiments, the first layer 110 is a dielectric material which is intended to be treated. Typically, the dielectric material would be deposited at higher temperatures (e.g., >500° C.) because lower temperature deposition can result in poor quality films. However, embodiments of the invention allow for low temperature deposition (ALD) of a dielectric (or other film) because the inventors have found that, surprisingly, exposure to an inductively coupled plasma can repair or increase the quality of the film. This allows for deposition at lower temperatures, preserving the thermal budget of the device being formed.

Figure 2A:
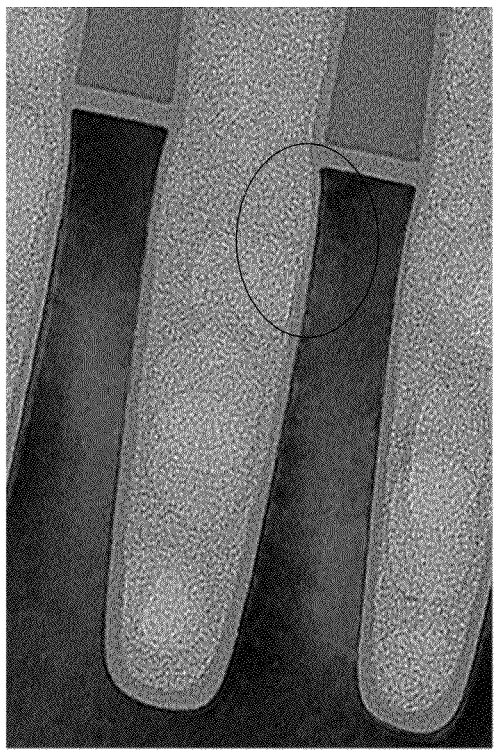
FIG. 2A shows a TEM image of a film after exposure to an oxygen plasma at 25° C.
Figure 2B:
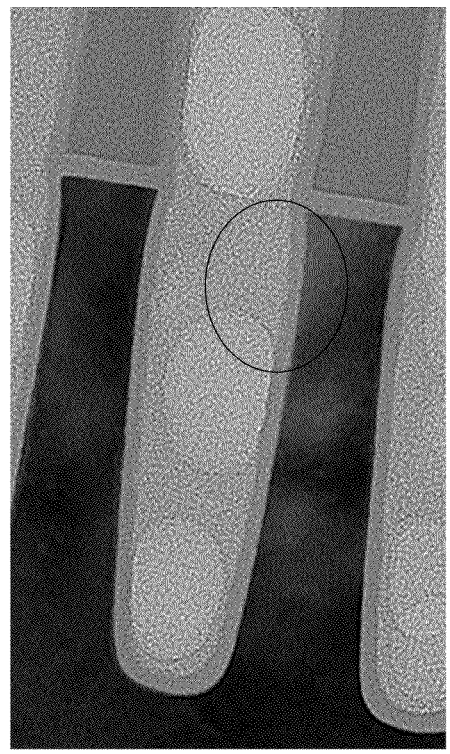
FIG. 2B shows a TEM image of a film after exposure to an oxygen plasma at 400° C.

In some embodiments, the substrate 100, or first layer 110 on the substrate 100 is heated to a temperature of above room temperature to facilitate film treatment. It is found that higher temperature can facilitate side wall treatment. FIG. 2A shows a layer deposited on a trench and treated at 25° C. with an inductively coupled oxygen plasma. FIG. 2B shows a layer deposited on a trench and treated at 400° C. with the same type of plasma. In some embodiments, the substrate may be heated to a temperature of about 250 to about 600 degrees Celsius. The actual maximum substrate temperature may vary based upon hardware limitations and/or the thermal budget of the substrate being processed. In some embodiments, the substrate 100 or first layer 110 is heated to above room temperature to about 600 degrees Celsius. In some embodiments, the substrate 100 or first layer 110 is heated to about 300 to about 550 degrees Celsius. In some embodiments, the substrate 100 or first layer 110 is heated to about 400 to about 550 degrees Celsius.

In some embodiments, the substrate 100 may be positioned in the processing chamber such that heat transfer to the substrate is maximized, for example, between the substrate 100 and a substrate support on which the substrate 100 rests during, for example, the treatment process. As such, the substrate 100 may be secured to the substrate support using a chucking device, such as an electrostatic chuck (ESC), a vacuum chuck, or other suitable device. Chucking the substrate 100 may facilitate reproducible heat transfer even at low pressures (the process pressure region), for example, in a range of about 3 mTorr to about 120 mTorr, or at about 4 mTorr to about 1 Torr, or at about 10 to about 80 mTorr, at about 10 to about 40 mTorr, or at about 10 to about 35 mTorr. Optionally, in embodiments where an electrostatic chuck is provided to secure the substrate 100, a second plasma may be formed above the substrate 100 to facilitate stabilization of the substrate temperature as the substrate is chucked. For example, the second plasma may be formed from a non-reactive gas including at least one of nitrogen ($N_2$), helium (He), or the like, to preheat the substrate 100 such that upon chucking the substrate 100 to the substrate support and extinguishing the plasma, the substrate 100 does not experience a dramatic change in temperature which could lead to process variation and/or wafer breakage. As used herein, non-reactive gases include gases that do not substantially react with the substrate (e.g., do not substantially deposit upon or etch the substrate).

Substrate bias can be used to increase treatment depth and to treat high aspect ratio structures (>10:1). In some embodiments, bias is applied to the substrate (or pedestal, etc.) when the aspect ratio of the structures is in the range of about 10:1 to about 30:1.

Optionally, prior to, for example, treatment of the first layer 120, the process chamber may be pre-conditioned to reduce residual oxygen content in the processing volume. For example, residual oxygen content such as from moisture, water ($H_2O$) or the like may result in undesired parasitic oxidation of the substrate 100 or the first layer 110. To prevent this from happening, the interior of the process chamber (including the lid, sidewall, and pedestal or chuck) may be pre-conditioned with a pre-conditioning plasma formed from a pre-conditioning gas. The pre-conditioning gas may include, for example, an inert gas, hydrogen ($H_2$) and an inert gas, ammonia ($NH_3$), hydrogen ($H_2$) and nitrogen ($N_2$), or any suitable gas and/or combination of gases that may be reactive with oxygen and/or oxygen-containing gases. In some embodiments, pre-conditioning may be performed prior to, or during, chucking (e.g., securing the substrate to the chuck). In some embodiments, pre-conditioning may be performed prior to heating the substrate, or prior to treatment of the first layer 110.

The first layer 120 is exposed to an inductively coupled plasma (ICP) formed from a process gas. ICP exposure can result in, for example, treatment (nitridation or oxidation) of the first layer 120, resulting in the formation of a substantially conformal film 120. The film 120 can be deposited onto the first layer 110 or can be formed at the surface of the first layer 110. As used in this specification and the appended claims, the term "substantially conformal film" means a film that has a substantially uniform thickness. As used in this specification and the appended claims, the term "substantially uniform thickness means that the thickness along a surface (e.g., a trench sidewall) does not vary by more than about 40%, or by more than about 30%, or by more than about 20% or by more than about 10%.

The process gas can be any suitable gas depending on the desired process. For example, nitrogen or a nitrogen-containing gas may be used for nitriding the layer, or oxygen or an oxygen-containing gas may be used for oxidizing the layer. In some embodiments, the process gas comprises nitrogen, a nitrogen-containing gas or a nitrogen-inert gas mixture. In some embodiments, the process gas comprises oxygen, an oxygen-containing gas or an oxygen-inert gas mixture. The pressure of the process gas can also be changed. In some embodiments, the process gas is maintained at a pressure in the range of about 3 mTorr to about 120 mTorr, or about 4 mTorr to about 1 Torr, or about 10 to about 80 mTorr, or about 10 mTorr to about 40 mTorr, or about 10 mTorr to about 35 mTorr to form a layer. The process gas comprises, for example, nitrogen ($N_2$), ammonia ($NH_3$), nitric oxide (NO), nitrous oxide ($N_2O$), or combinations thereof. Optionally, the process gas may further include an inert gas, such as a noble gas, for example, argon (Ar), helium (He), krypton (Kr), Xenon (Xe) or the like. The mixture with inert gas can affect active species energy, density and possibly directionality. In some embodiments, the process gas comprises ammonia ($NH_3$), or nitrogen and hydrogen ($H_2$), or mixtures thereof. In some embodiments, the process gas comprises ammonia ($N_{H3}$) and an inert gas, for example. Argon (Ar).

The process gas may be supplied at a total gas flow from about 100 to about 1000 sccm, or at about 400 sccm. The process gas may utilize a range of compositions. In some embodiments, the process gas may comprise about 10 to about 100 percent of $N_2$ or $O_2$ (e.g., an $N_2$ flow of between about 100-1000 sccm). In some embodiments, the process gas may comprise about 10-100 percent of $NH_3$ (e.g., an $NH_3$ flow of between about 50-1000 sccm). In some embodiments, the process gas may comprise about 10 to about 80 percent of $H_2$ (e.g., an $H_2$ gas flow of about 100-800 sccm) in combination with about 20 to about 90 percent of $N_2$ (e.g., an $N_2$ flow of about 200-900 sccm). In some embodiments, the process gas may comprise about 10-99 percent of the inert gas (e.g., an inert gas flow of about 100-990 sccm). In some embodiments, the process gas may comprise about 80-99 percent of the inert gas (e.g., an inert gas flow of about 800-990 sccm).

The process gas may be introduced into the processing chamber and used to form the inductively coupled plasma. In some embodiments, the plasma density may be about $10^{10}$ to about $10^{12}$ ions/cm$^3$. The plasma may be formed by using an RF source power. In some embodiments, the RF source power is up to about 2500 Watts. The RF source power may be provided at any suitable RF frequency. For example, in some embodiments, the RF source power may be provided at a frequency about 2 to about 100 MHz. The frequency can be for example, 2 MHz, 13.56 MHz, 40 MHz, 60 MHz or 100 MHz.

The plasma may be pulsed or continuously applied at up to about 2500 Watts. For example, the plasma may applied continuously at up to about 2500 Watts for a duration of about 60 to about 200 seconds. In some embodiments, the plasma is applied continuously for less than 150 seconds. The duration may be adjusted (e.g., shortened) to limit damage to the device or increased to provide greater exposure. Alternatively, the plasma may be pulsed at a pulse frequency of about 4 kHz to about 15 kHz. The pulsed plasma may have a duty cycle of about 2% to about 70%, where the duty cycle and/or RF source power may be adjusted to limit damage to the device. Using an inductively coupled plasma allows processing to occur at lower power levels than a capacitively coupled plasma. At lower power levels, the ion energy does not cause significant damage to the substrate, layer or film exposed directly to the plasma. In some embodiments, there is substantially no capacitively coupled plasma generated. As used in this specification and the appended claims, the term "no capacitively coupled plasma" means that less than about 10% of the overall plasma power results from capacitive coupling.

The thickness of the film can have an impact on the effectiveness of the inductively coupled plasma treatment. Without being bound by any particular theory of operation, it is believed that if the film is too thick, the plasma ions will not completely penetrate, leaving an untreated portion of the film. In some embodiments, the film has a thickness less than about 500 Å before treatment with the inductively coupled plasma. In one or more embodiments, the film has a thickness less than about 400 Å, 300 Å, 200 Å, 100 Å, 50 Å, 40 Å, 30 Å, 20, Å or 10 Å prior to exposure to the inductively coupled plasma.

In some embodiments, the film is about one monolayer thick before exposure to the inductively coupled plasma to create the substantially conformal film.

The film can be grown or deposited by any suitable technique. For example, atomic layer deposition, or chemical vapor deposition, can be used to deposit a film comprising a dielectric material. Generally, atomic layer deposition exposing the surface to a precursor gas which chemisorbs to the surface. The chemisorbed compound is then exposed to a reactant (e.g., a reductant), or more than one separate reactant, to produce a final film. These exposures are repeated alternating between precursor and reactant to grow a film of desired thickness. Atomic layer deposition reactions are theoretically self-limiting with a single monolayer being deposited per cycle. In some embodiments, a single monolayer, or a single cycle precursor/reactant cycle, is deposited to form a film. The film is then exposed to the inductively coupled plasma to form the substantially conformal film. This can be repeated until the film of desired thickness is grown. This allows for excellent control of the film deposition and treatment cycles to produce a substantially conformal film.

Figure 1C:
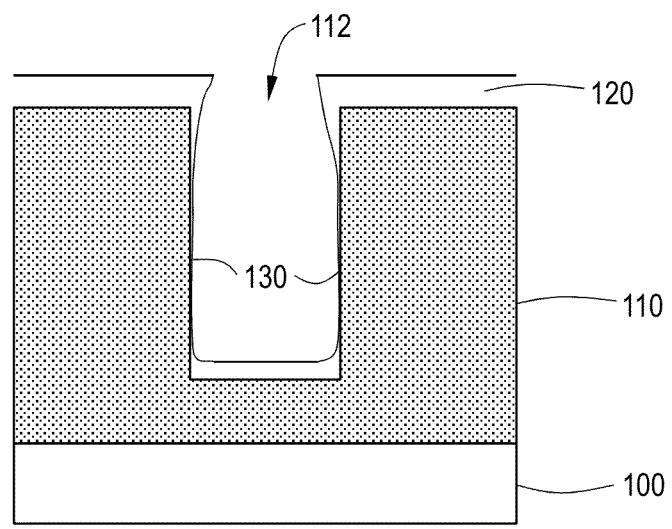

FIG. 1C shows a schematic view of a film 120 treated with a capacitively coupled plasma. It can be seen that the film on the sidewalls of the trench have been damaged or destroyed leaving practically no film left on the sidewalls. The described methods and apparatus are useful for treating these films with minimal or no deterioration to the film. The inductively coupled plasma is believed to have low ion energy, especially in pulsed configurations. It has been shown that ICP plasma treatment can conformally treat films having a thickness less than about 300 Å each time. Therefore, by cyclic treatment and deposition, conformal treatment of relatively thicker films can be achieved. The cyclic treatment and deposition can be done within a single chamber or between two separate chambers.

Figure 3A:
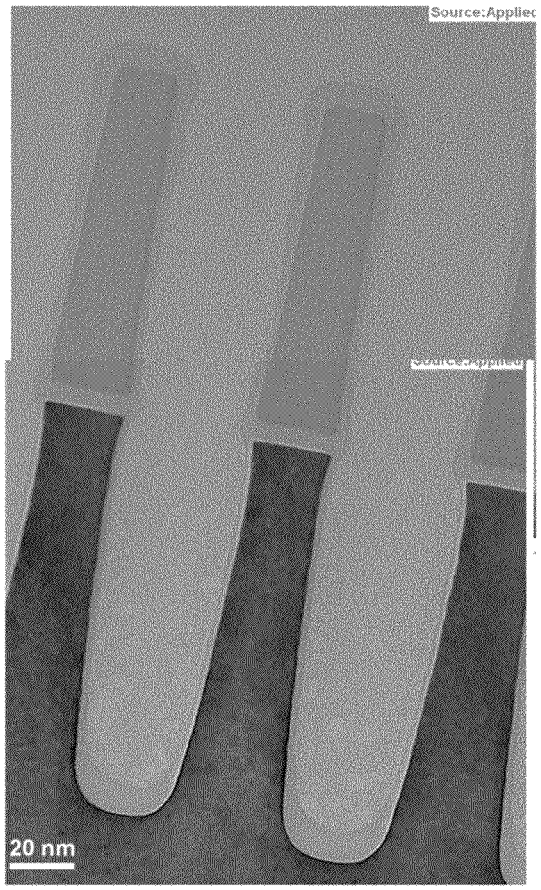
FIG. 3A shows a TEM image of a film after deposition, exposure to a capacitively coupled plasma and wet etching showing that the films on the sidewall of the trench has not been adequately treated.
Figure 3B:
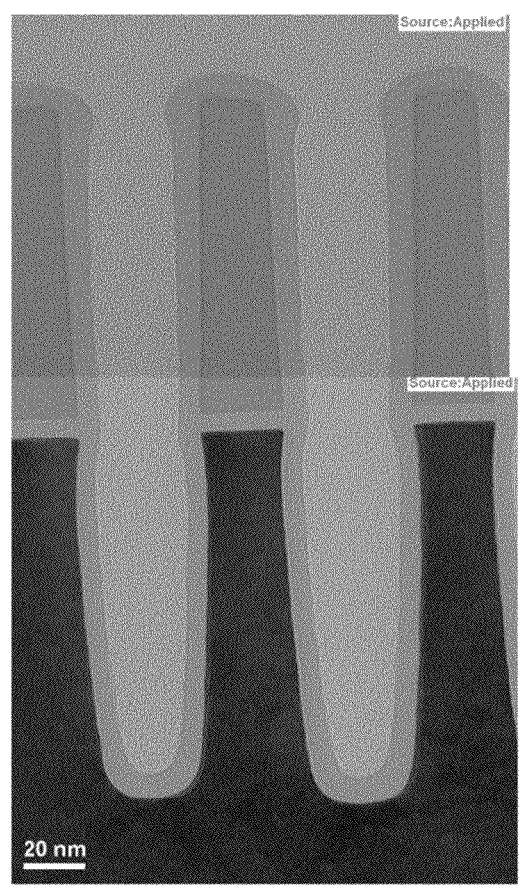
FIG. 3B show a TEM image of a film after deposition, exposure to an inductively coupled plasma and wet etching in accordance with one or more embodiment of the invention.

The conformal treatment results can be seen in FIGS. 3A and 3B. FIG. 3A shows a TEM image of an ALD oxide film after wet etch. The oxide film was treated with a capacitively coupled plasma prior to etching. It can be seen that the oxide film has been almost completely etched from the sidewall, suggesting that there was a lack of treatment on the side wall. FIG. 3B shows a TEM image of a similar ALD oxide film after wet etching where the oxide was treated with an inductively coupled plasma prior to etch. It can be seen that the film thickness on the sidewall is substantially conformal, uniform thickness. The ICP effectively treated the sidewalls so that the wet etch did not damage the conformality.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required. Indeed, other embodiments relate to deposition processes under very mild conditions without a plasma.

According to one or more embodiments, the substrate is subjected to processing prior to and/or after forming the conformal layer by exposure to the inductively coupled plasma. For example, in some embodiments, after exposure to the inductively coupled plasma, the film is subjected to etch conditions. The conformal film may be substantially resistant to etching, meaning that there is less than a 25% change in conformality upon etching. This additional processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, preclean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present invention, other and further embodiments of the invention may be devised without departing from the basic scope thereof, and the scope thereof is determined by the claims that follow.

What is claimed is:

1. A method of forming a film, the method comprising:
   placing a substrate on a substrate support of a processing chamber, the substrate having a first layer thereon comprising a structure including at least one sidewall, the substrate having a film comprising an oxide deposited on the at least one sidewall of the structure; and
   exposing the film to an inductively coupled plasma formed from a process gas comprising one or more of oxygen and an oxygen-containing gas and oxygen-inert gas mixture to form a substantially conformal film.

2. The method of claim 1, wherein the film comprises a nitride film.

3. The method of claim 2, wherein the process gas comprises one or more of nitrogen and a nitrogen-containing compound and nitrogen-inert gas mixture.

4. The method of claim 1, wherein the film has a thickness less than about 300 Å.

5. The method of claim 1, further comprising depositing the film on the substrate.

6. The method of claim 5, wherein the film is deposited by one or more of an atomic layer deposition process and a chemical vapor deposition process.

7. The method of claim 5, wherein the film has a thickness less than about 300 Å.

8. The method of claim 5, wherein depositing the film on the substrate and exposing the substrate to the inductively coupled plasma occurs in a single processing chamber.

9. The method of claim 5, wherein the film is deposited in a first chamber and the method further comprises moving the substrate from the first chamber to a second chamber before exposing the film to the inductively coupled plasma.

10. The method of claim 9, wherein the substrate is not exposed to ambient conditions during movement from the first chamber to the second chamber.

11. The method of claim 1, further comprising heating the substrate to a temperature less than about 600° C.

12. The method of claim 1, further comprising biasing substrate with DC or AC power.

13. A method of forming a film, the method comprising:
(a) placing a substrate having a first layer thereon on a substrate support of a first processing chamber, the first layer including a structure with at least one sidewall;
(b) depositing a film on the substrate in the first chamber so that the film covers at least one sidewall of the structure, the film having a thickness less than about 300 Å;
(c) exposing the film to an inductively coupled plasma formed from a process gas to form a substantially conformal film on the at least one sidewall; and
(d) repeating (b) and (c) until a film of desired thickness is formed, the film on the at least one sidewall being substantially conformal.

14. The method of claim 13, wherein depositing the film on the substrate is performed by atomic layer deposition and the film has a thickness of about one monolayer before exposure to the inductively coupled plasma.

15. The method of claim 13, further comprising heating the substrate to temperatures less than about 600° C. during (b) and (c).

16. The method of claim 13, wherein the process gas comprises one or more of nitrogen, oxygen, a nitrogen-containing compound and an oxygen-containing compound.

17. The method of claim 13, further comprising moving the substrate from the first chamber to a second chamber before exposure to the inductively coupled plasma.

18. A method of forming a film, the method comprising repeating sequentially depositing a film having a thickness less than about 300 Å on at least a sidewall of a structure on a surface of a substrate and exposing the film on at least the sidewall to an inductively coupled plasma to form a substantially conformal layer on the sidewall.

* * * * *